(12) United States Patent
Jeong

(10) Patent No.: US 7,274,620 B2
(45) Date of Patent: Sep. 25, 2007

(54) SEMICONDUCTOR MEMORY DEVICE

(75) Inventor: Duk-Ju Jeong, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 90 days.

(21) Appl. No.: 11/332,199

(22) Filed: Jan. 17, 2006

(65) Prior Publication Data
US 2007/0002652 A1   Jan. 4, 2007

(30) Foreign Application Priority Data
Jun. 30, 2005 (KR) .................. 10-2005-0058496

(51) Int. Cl.
*G11C 8/00* (2006.01)
(52) U.S. Cl. ..................... 365/233; 365/203
(58) Field of Classification Search ............ 365/233, 365/193, 203, 191
See application file for complete search history.

(56) References Cited

U.S. PATENT DOCUMENTS

| | | | | |
|---|---|---|---|---|
| 4,766,571 A | * | 8/1988 | Kawashima | ........... 365/189.08 |
| 5,206,830 A | | 4/1993 | Isobe et al. | |
| 5,301,164 A | | 4/1994 | Miyawaki | |
| 5,301,165 A | * | 4/1994 | Ciraula et al. | ........... 365/233.5 |
| 5,583,815 A | * | 12/1996 | Choi et al. | .............. 365/189.05 |
| 5,973,990 A | * | 10/1999 | Sakurai | ...................... 365/233 |
| 6,801,468 B1 | | 10/2004 | Lee | |

FOREIGN PATENT DOCUMENTS

| | | |
|---|---|---|
| JP | 04-026986 | 1/1992 |
| JP | 04-082079 | 3/1992 |
| JP | 04-157694 | 5/1992 |
| JP | 2003-308692 | 10/2003 |
| KR | 1020030082353 | 10/2003 |

* cited by examiner

*Primary Examiner*—Anh Phung
(74) *Attorney, Agent, or Firm*—McDermott Will & Emery LLP

(57) ABSTRACT

The present invention for preventing a data error by satisfying specifications of tHD and tCBPH is provided. The semiconductor memory device having an enough margin for a write/read operation includes a pre-charging block for performing a pre-charging operation based on a chip selection control signal; a write/read strobe generating block for performing a write/read operation based on the chip selection control signal and a chip selection signal; and a chip selection buffering block for generating the chip selection control signal based on the chip selection signal to control a timing of the pre-charging operation and a timing of the write/read operation.

17 Claims, 6 Drawing Sheets

SEMICONDUCTOR MEMORY DEVICE

FIELD OF THE INVENTION

The present invention relates to a semiconductor memory device; and, more particularly, to a semiconductor memory device, which can prevent a data error generally occurring due to an enabling timing of a chip selection signal in a pseudo static random access memory device.

DESCRIPTION OF THE RELATED ART

Generally, dynamic random access memory (DRAM) devices store information into capacitors in the form of charges. The stored charges of the capacitors are distributed to corresponding bit lines through transistors, and sense amplifiers amplify voltages to read data. Since a memory cell includes one transistor and one capacitor, a memory device with large capacitance can be implemented in a smaller area.

Memory devices have currently been scaled down to achieve several intended functions such as high operation speed, decreased power consumption and minimized processing systems. As memory devices have been minimized, the capacitor areas of the memory cells have been reduced, resulting in a decreased capacitance level. Due to the decreased capacitance level, an amount of charges that can be retained is reduced even if data are inputted at the same voltage level with respect to the capacitors.

A refresh operation is generally performed periodically to compensate the decreased amount of charges of the capacitors that can be retained. The refresh operation reads data stored into the capacitors of the memory cells through employing bit lines and then, the read data are amplified by sense amplifiers. The amplified data are rewritten onto the capacitors of the original memory cells.

Therefore, if a data retention characteristic is degraded in micronized devices, it is often required to shorten a period of the refresh operation to compensate the degradation of the data retention characteristic. However, if the refresh operation period is shortened, external processing devices cannot access DRAM devices during the refresh operation and thus, the processing systems may perform poorly.

Also, if the period of the refresh operation is shortened, current for the refresh operation may be consumed more highly. Particularly, it may be difficult to satisfy a low level of standby current required for a data retention mode in portable devices that operate by batteries. Thus, DRAM devices cannot be applied to those portable devices requiring low power consumption.

As one method of resolving the above limitation, a pseudo static random access memory (PSRAM) device has been introduced. The PSRAM device operates similarly to a static random access memory (SRAM) device. In the PSRAM device, among memory access cycles, a cycle of a read operation and a write operation and a cycle of a refresh operation run consecutively. That is, since the refresh operation is executed within one memory access cycle, it is possible to hide the refresh operation with respect to an external access operation, and thus, a DRAM device can operate as a SRAM device.

FIG. 1 is a timing diagram showing an operation of a conventional PSRAM device for controlling a chip selection signal.

A period from a rising edge of a clock CLK to a rising edge of a chip selection signal CSB is called 'tHD'. However, the conventional PSRAM device has a high value of a tHD specification. That is, the chip selection signal CSB is disabled at the next clock CLK after the last data d3 is inputted. However, the conventional tHD specification cannot satisfy the minimum period of 2 ns.

In the conventional tHD specification, after the tHD period, the chip selection signal CSB is enabled immediately as a period of 'tCBPH' representing a width of a high pulse of the chip selection signal CSB is passed by. Herein, the tCBPH period is generally 5 ns. If the chip selection signal CSB is enabled immediately after the state that the tHD period is passed by and the tCBPH period is satisfied, the chip selection signal CSB is specifically set to be enabled before a rising edge of the next clock CLK. Therefore, when the tHD period is 2 ns, it may be difficult to write the data d3, which is inputted as being synchronized with the clock CLK, on a memory cell.

SUMMARY OF THE INVENTION

It is, therefore, an object of the present invention to provide a semiconductor memory device, which can prevent a data error by satisfying specifications of tHD and tCBPH and writing a lastly inputted data at a tHD interval on a memory cell of a synchronous pseudo static random access memory (PSRAM) device.

In accordance with an aspect of the present invention, there is provided a semiconductor memory device, including a pre-charging block for performing a pre-charging operation based on a chip selection control signal; a write/read strobe generating block for performing a write/read operation based on the chip selection control signal and a chip selection signal; and a chip selection buffering block for generating the chip selection control signal based on the chip selection signal to control a timing of the pre-charging operation and a timing of the write/read operation.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE INVENTION

A semiconductor memory device in accordance with exemplary embodiments of the present invention will be described in detail with reference to the accompanying drawings.

Figure 1:
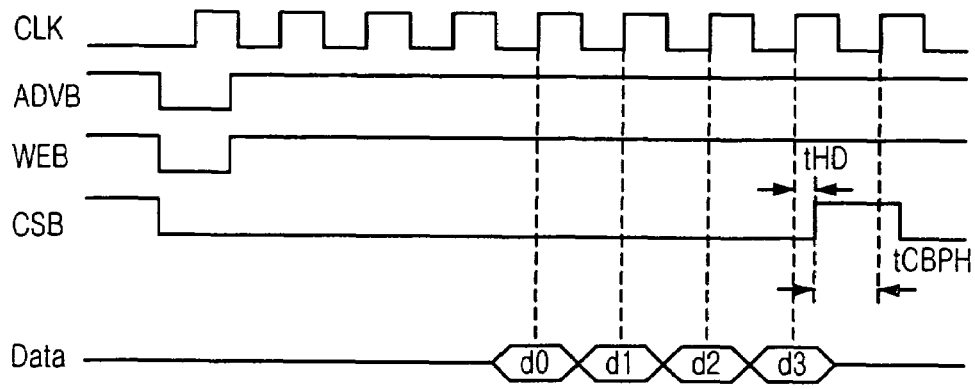
FIG. 1 is a timing diagram illustrating an operation of a conventional semiconductor memory device.
Figure 2:
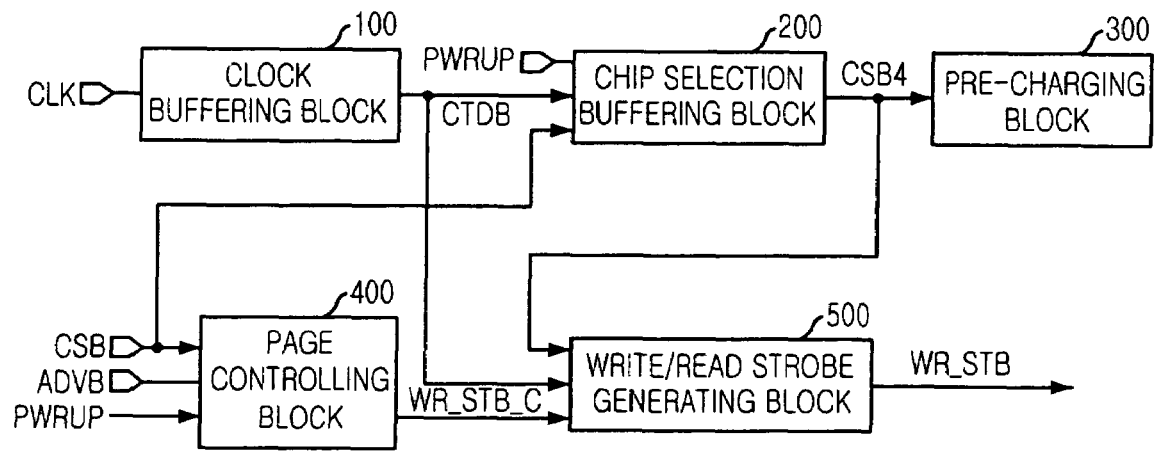
FIG. 2 is a configuration diagram illustrating a semiconductor device in accordance with an embodiment of the present invention.

FIG. 2 is a configuration diagram of a semiconductor memory device in accordance with an embodiment of the present invention.

The semiconductor memory device includes a clock buffering block 100, a chip selection buffering block 200, a pre-charging block 300, a page controlling block 400, and a write/read strobe generating block 500.

The clock buffering block 100 buffers a clock CLK and generates a clock transition detection signal CTDB for every rising edge of the clock CLK. The chip selection buffering block 200 buffers a power-up signal PWRUP, the clock transition detection signal CTDB and a chip selection signal CSB and outputs a chip selection controlling signal CSB4 for determining a pre-charge operation of a word line. The pre-charging block 300 controls a pre-charge operation according to the chip selection control signal CSB4.

The page buffering block 400 controls a page address according to the chip selection signal CSB, an address transition control signal ADVB and the power-up signal PWRUP and outputs a write/read strobe control signal WR_STB_C. The write/read strobe generating block 500 controls a strobe operation according to the chip selection control signal CSB4, the clock transition detection signal CTDB and the write/read strobe control signal WR_STB_C and outputs a write/read strobe signal WR_STB.

Figure 3:
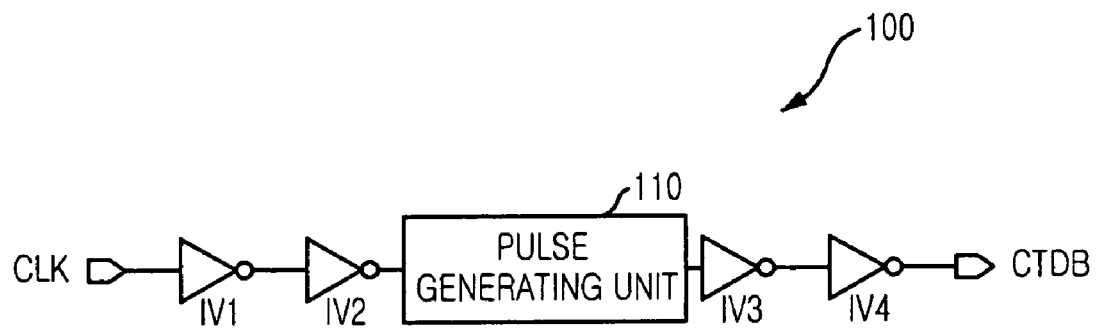
FIG. 3 is a detailed circuit diagram of a clock buffering block illustrated in FIG. 2.

FIG. 3 is a detailed circuit diagram of the clock buffering block 100 illustrated in FIG. 2.

The clock buffering block 100 includes first to fourth inverters IV1 to IV4, and a first pulse generating unit 110. The first inverter IV1 and the second inverter IV2 delay the clock CLK without an inversion and output an input signal IN. The first pulse generating unit 110 outputs an output signal OUT with a certain pulse width according to the input signal IN. The third inverter IV3 and the fourth inverter IV4 delay the output signal OUT without an inversion and output the clock transition detection signal CTDB. On the basis of these sequential steps, the clock buffering block 100 generates the clock transition detection signal CTDB for every rising edge of the clock CLK.

Figure 4:
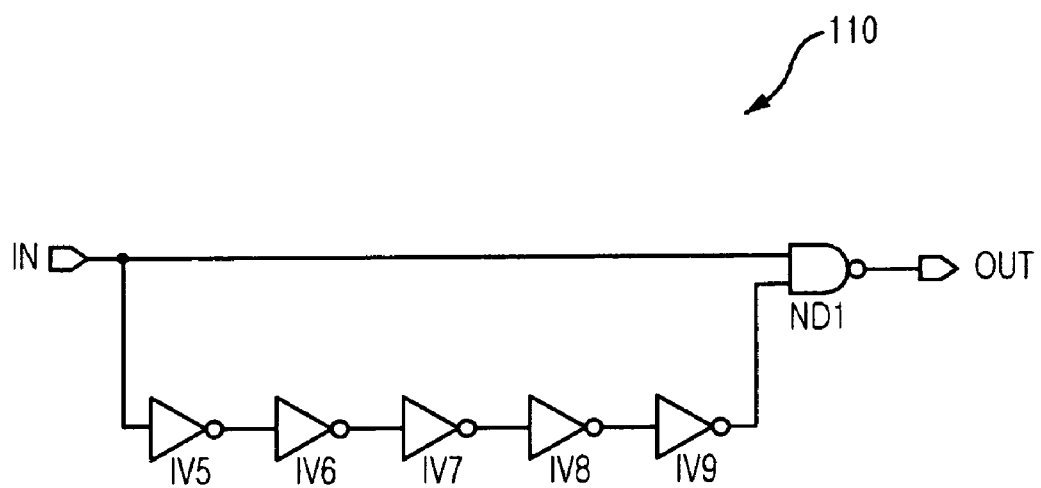
FIG. 4 is a detailed circuit diagram of a first pulse generating unit illustrated in FIG. 3.

FIG. 4 is a detailed circuit diagram of the first pulse generating unit illustrated in FIG. 3.

The first pulse generating unit 110 includes fifth to ninth inverters IV5 to IV9 and a first NAND gate ND1. The fifth to the ninth inverters IV5 to IV9 delay the input signal IN with an inversion. The first NAND gate ND1 performs a NAND operation on the input signal IN and an output signal of the ninth inverter IV9 and outputs the output signal OUT with the certain pulse width. Hence, the first pulse generating unit 110 outputs the output signal OUT of a low pulse when the input signal IN is transited from a low level to a high level.

Figure 5:
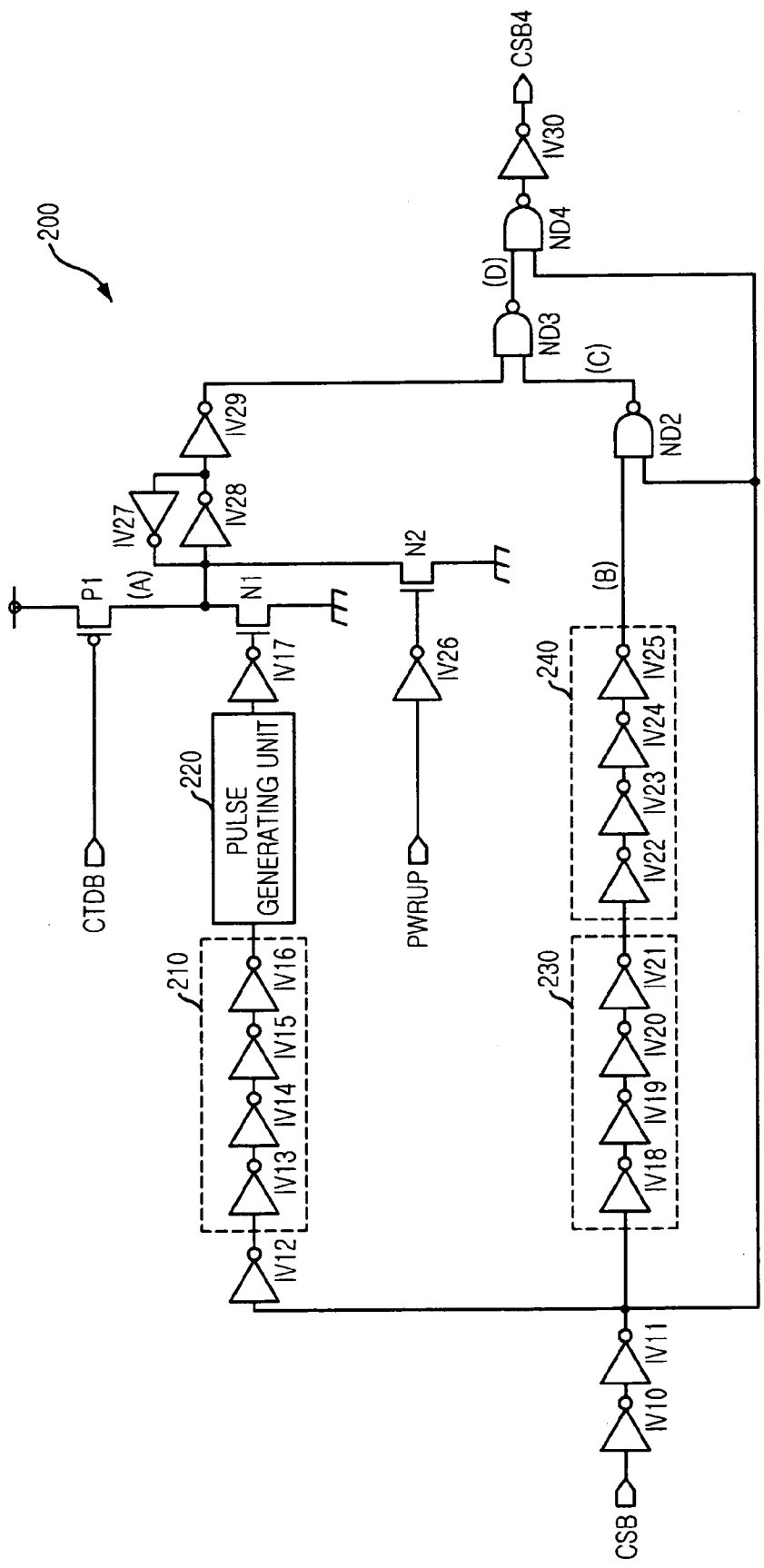
FIG. 5 is a detailed circuit diagram of a chip selection buffering block illustrated in FIG. 2.

FIG. 5 is a detailed circuit diagram of the chip selection buffering block illustrated in FIG. 2.

The chip selection buffering block 200 includes tenth to thirteenth inverters IV10 to IV30, a second pulse generating unit 220, a first P-channel metal oxide semiconductor (PMOS) transistor, P1, a first N-channel metal oxide semiconductor (NMOS) transistor N1, and a second NMOS transistor N2, and second to fourth NAND gates ND2 to ND4.

The tenth inverter IV10 and the eleventh inverter IV11 delay the chip selection signal CSB. The twelfth inverter IV12 inverts an output of the eleventh inverter IV11. A first delaying unit 210 includes the thirteenth to sixteenth inverters IV13 to IV16 and delay an output of the twelfth inverter IV12 for a predetermined time. The second pulse generating unit 220 generates a signal with a certain pulse width according to an output of the first delaying unit 210. A second delaying unit 230 including the eighteenth inverter IV18 to the twenty-first inverter IV21 and a third delaying unit 240 including the twenty-second inverter IV22 to the twenty-fifth inverter IV25 delay the output of the eleventh inverter IV11 for a predetermined time and transmits the output to a first node B.

The first PMOS transistor P1 is connected between a power supply terminal and a second node A and is supplied with the clock transition detection signal CTDB through a gate. The first NMOS transistor N1 is connected between the first node A and a ground voltage terminal and is supplied with an output of the seventeenth inverter IV17 through a gate. The twenty-seventh inverter IV27 and the twenty-eighth inverter IV28 serve as a latching unit, which latches an output of the second node A. The second NMOS transistor N2 is connected between the second node A and a ground voltage terminal and is supplied with the power-up signal PWRUP through a gate, wherein the power-up signal PWRUP is inverted by the twenty-sixth inverter IV26.

The second NAND gate ND2 performs a NAND operation to the output of the first node B and the output of the eleventh inverter IV11 and outputs the NAND operation result to a third node C. The third NAND gate ND3 performs a NAND operation to an output of the twenty-ninth inverter IV29 and an output of the third node C and outputs the NAND operation result to a fourth node D. The fourth NAND gate ND4 performs a NAND operation to an output of the fourth node D and the output of the eleventh inverter IV11. The thirtieth inverter IV30 inverts an output of the forth NAND gate ND4 and outputs the chip selection control signal CSB4.

Figure 6:
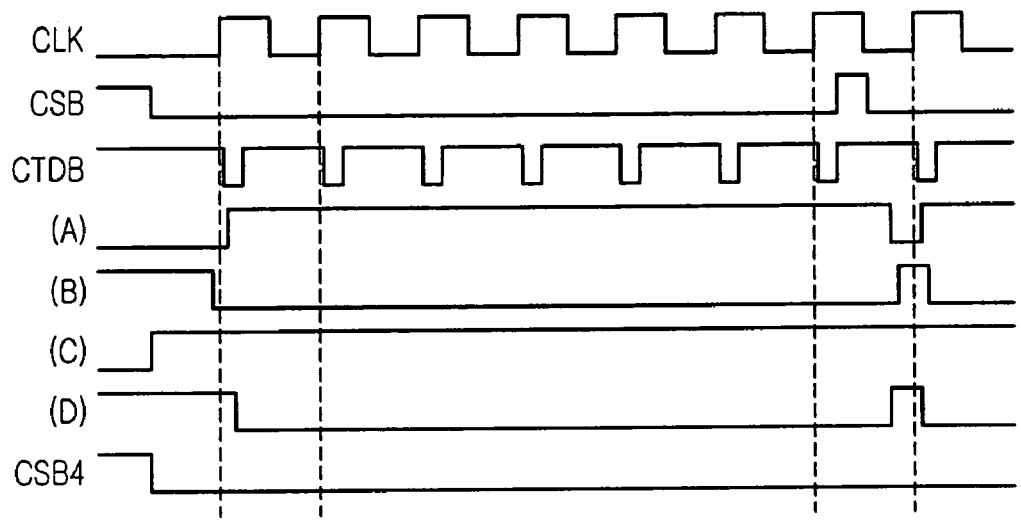
FIGS. 6 and 7 are waveform diagrams of exemplary operations of the chip selection buffering block illustrated in FIG. 5.
Figure 7:
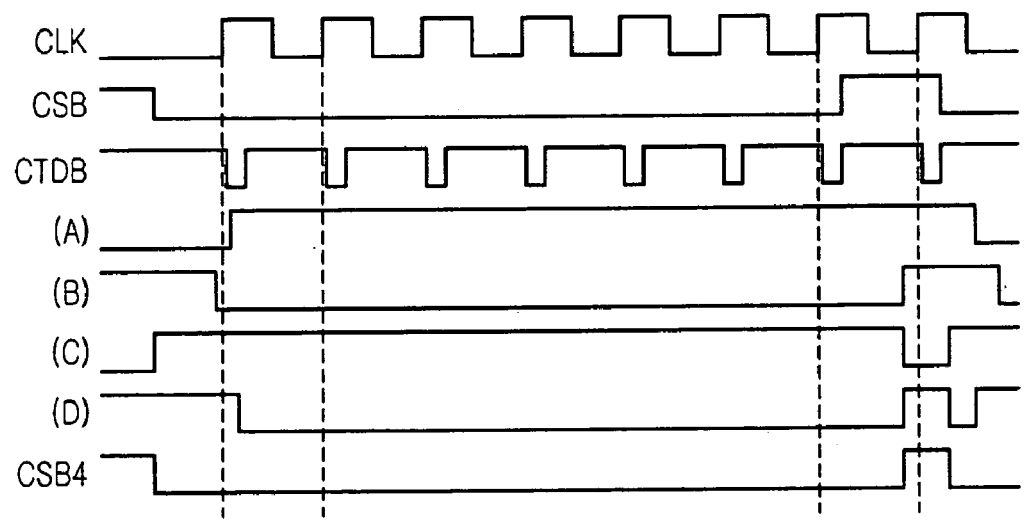

FIG. 6 is a waveform diagram illustrating an operation of the chip selection buffering block 200 when a tCBPH period is shorter than one cycle of the clock CLK. FIG. 7 is a waveform diagram illustrating an operation of the chip selection buffering block 200 when a tCBPH period is longer than one cycle of the clock CLK.

As illustrated in FIG. 6, when the chip selection signal CSB at the tCBPH period with a narrow pulse width is inputted from a pad, the chip selection control signal CSB4 retains a low level. The pre-charge operation is not carried out by continuously retaining the low level of the chip selection control signal CSB4. Hence, it is possible to write a data, which is inputted lastly during an interval of tHD, on a memory cell.

On the other hand, as illustrated in FIG. 7, the chip selection signal CSB at a tCBPH period with a wide pulse width is inputted from a pad, the chip selection control signal CSB4 is in a high level. As the chip selection control signal CSB4 is transited from a low level to a high level, the pre-charge operation that disables a currently enabled word line is carried out to terminate a write/read operation. That is, since the chip selection control signal CSB4 retains the high level due to a certain delay time, the pre-charge operation with respect to the word line is carried out after the last input data is written on the memory cell.

Figure 8:
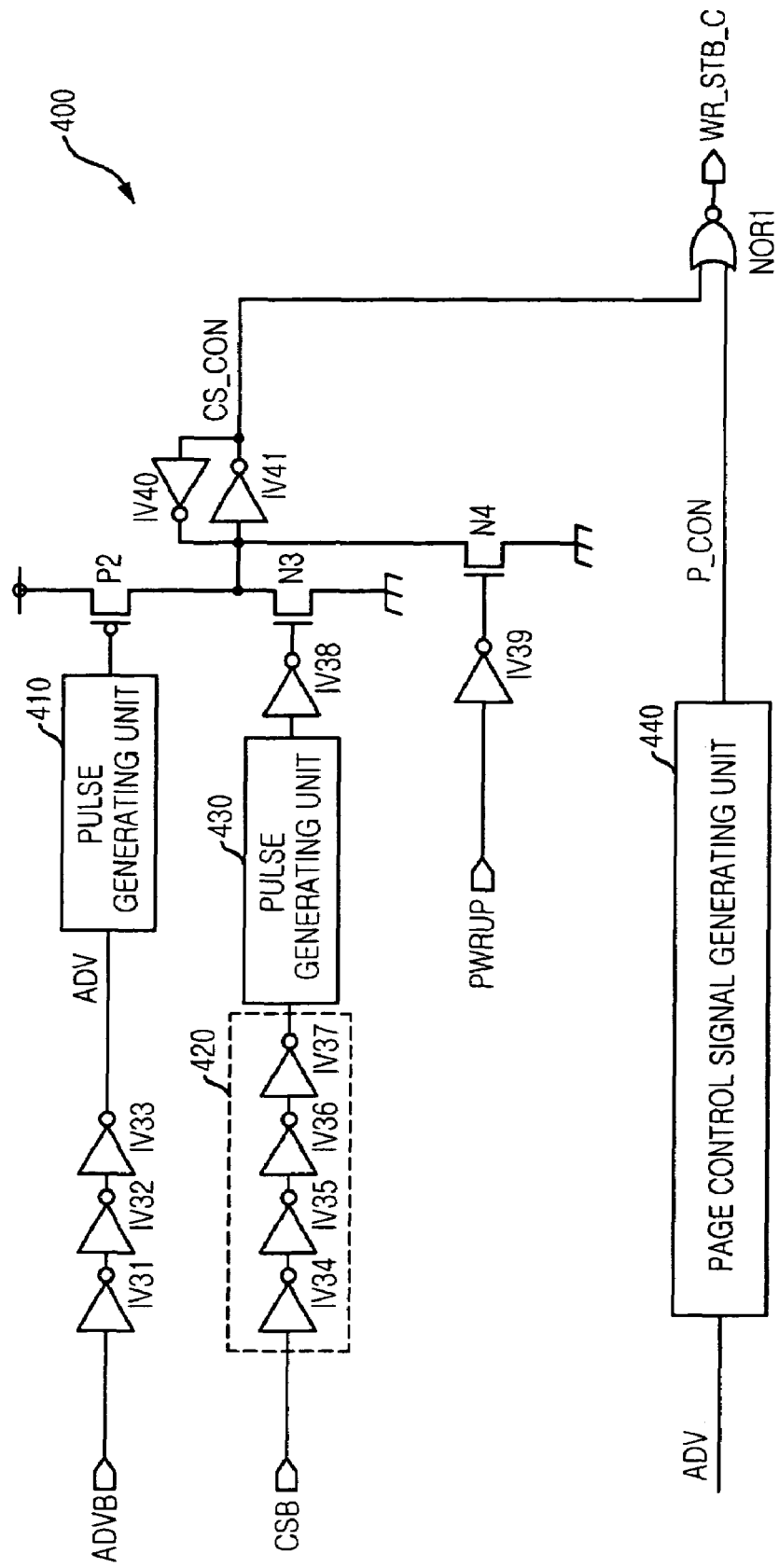
FIG. 8 is a detailed circuit diagram of a page controlling block illustrated in FIG. 2.

FIG. 8 is a detailed circuit diagram of the page controlling block 400 illustrated in FIG. 2.

The page controlling block 400 includes thirty-first to forty-first inverters IV31 to IV41, a third pulse generating unit 410, a fourth pulse generating 430, a fourth delaying unit 420, a second PMOS transistor P2, third and fourth NMOS transistors N3 and N4, a page control signal generating unit 440, and a first NOR gate NOR1.

The thirty-first to thirty-third inverters IV31, IV32 and IV33 invert and delay the address transition control signal ADVB and, output the inverted address transition control signal. The third pulse generating unit 4010 outputs a signal with a certain width according to the inverted address transition control signal ADV. The fourth delaying unit 420 delays the chip selection signal CSB without an inversion. The fourth pulse generating unit 430 delays an output of the fourth delaying unit 420 and outputs a signal with a certain width.

The second PMOS transistor P2 and the third NMOS transistor N3 are connected between a power supply terminal and a ground voltage terminal. The second PMOS transistor P2 is supplied with an output of the third pulse generating unit 410 through a gate. The third NMOS transistor N3 is supplied with an output of the third eighth inverter IV38 through a gate.

The fortieth inverter IV40 and the forty-first inverter IV41 serving as a latching unit latch an output of the second PMOS transistor P2 and output another chip selection control signal CS_CON. The fourth NMOS transistor N4 is connected in parallel with the third NMOS transistor N3, and the power-up signal PWRUP inverted by the thirty-ninth inverter IV39 is inputted to the fourth NMOS transistor N4 through a gate.

The page control signal generating unit 440 generates a page control signal P_CON for controlling a page operation according to the address transition control signal ADV. The first NOR gate NOR1 performs a NOR operation to the other chip selection control signal CS_CON and the page control signal P_CON and outputs the write/read strobe control signal WR_STB_C.

Figure 9:
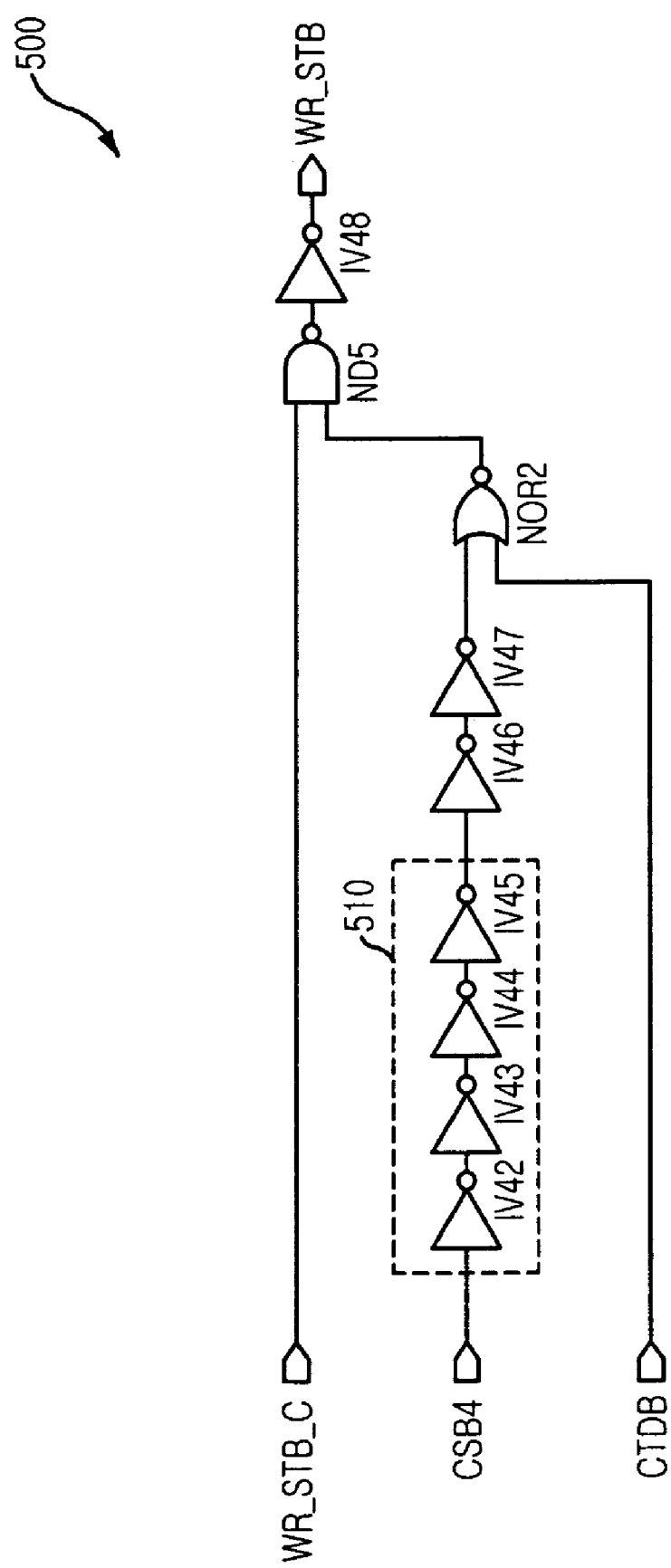
FIG. 9 is a detailed circuit diagram of a write/read strobe generating block illustrated in FIG. 2.

FIG. 9 is a detailed circuit diagram of the write/read strobe generating block 500 illustrated in FIG. 2.

The write/read strobe generating block 500 includes forty-second to forty-eighth inverters IV42 to IV48, a fifth NAND gate ND5, and a second NOR gate NOR2. The forty-second inverter to forty-seventh to inverters IV42 to IV47 delay the chip selection control signal CSB4 for a predetermined time. The second NOR gate NOR2 performs a NOR operation to an output of the forty-seventh inverter IV47 and the clock transition detection signal CTDB. The fifth NAND gate ND5 performs a NAND operation to the write/read strobe control signal WR_STB_C and an output the NOR gate NOR2. The forty-eighth inverter IV48 inverts an output of the fifth NAND gate ND5 and outputs the write/read strobe signal WR_STB.

Hereinafter, operation of the semiconductor memory device (i.e., the PSRAM device) configured as above will be described in detail.

The power-up signal PWRUP is transited from a low level to a high level while the PSRAM device is supplied with the initial power. At this time, values of internal latch circuits are determined. Thus, the second node A of the chip selection buffering block 200 latches a low level according to the power-up signal PWRUP.

If the PSRAM device operates asynchronously, the clock CLK is not toggled and thus the clock transition detection signal CTDB retains a high level continuously. As a result, the second node A is in a low level because of the power-up signal PWRUP and the fourth node D is in a high level, so that the chip selection control signal CSB4 becomes identical to a signal inputted to a chip selection signal CSB pad.

On the other hand, in the case of a synchronous PSRAM device, the input of the chip selection signal CSB satisfies the tHD specification between rising edges of the clock CLK. As illustrated in FIG. 6, operation of the PSRAM device when the tCBPH period is shorter than one cycle of the clock CLK will be described hereinafter.

When the clock CLK is transited from a low level to a high level, the clock buffering block 100 generates the clock transition detection signal CTDB, which is a low pulse, for every rising edge of the clock CLK. An output of the second pulse generating unit 220 is in a low level when the chip selection signal CSB is enabled in a low level.

As a result, the second node A latches a signal in a low level by the twenty-seventh inverter IV27 and the twenty-eighth inverter IV28 (i.e., the latching unit) and then latches a signal in a high level when the clock transition detection signal CTDB is inputted in a low level at the rising edge of the clock CLK.

The first node B is inputted with a signal obtained as the second delaying unit 230 and the third delaying unit 240 delay the chip selection signal CSB. That is, as illustrated in FIG. 6, when the chip selection signal CSB at the tCBPH period with the pulse width shorter than the delay time of the first node B is inputted from the pad, the chip selection signal CSB is in a low level as passing through the second NAND gate ND2 to the fourth NAND gate ND4. Hence, the chip selection control signal CSB4 retains a low level.

As the chip selection control signal CSB4 retains the low level, the pre-charging block 300 does not pre-charge a word line. Therefore, the lastly inputted data during the tHD interval can be written on a memory cell.

As illustrated in FIG. 7, when the chip selection signal CSB at the tCBPH period with the pulse width larger than the delay time of the first node B is inputted from the pad, the chip selection control signal CSB4 is transited to a high level and enabled in a low level again.

There is a predetermined delay time before the chip selection control signal CSB4 is transited to the high level. Thus, a data inputted at the tHD interval can be written on a memory cell for the predetermined delay time of the chip selection control signal CSB4. Next, when the chip selection control signal CSB4 is transited from a low level to a high level, the pre-charging block 300 performs a pre-charge operation that disables a currently enabled word line, thereby terminating the write/read operation.

Herein, the pre-charging block 300 disables the word line after the write/read operation is terminated. In accordance with the embodiment of the present invention, the pre-charge operation is set to be carried out when the chip selection control signal CSB4 is disabled.

The address transition control signal ADVB of the page controlling block 400 is synchronized with the clock CLK at the moment that an external instruction is inputted to the synchronous PSRAM device, whereby the address transition control signal ADVB is in a low level. Therefore, the page control signal generating unit 400 generates the page control signal P_CON at the moment that among the synchronous write/read operations, the write/read strobe signal WR_STB is enabled according to the address transition control signal ADVB.

When the address transition control signal ADVB is in a low level as an external instruction is inputted, the inverted address control signal ADV is in a high level and the output of the third pulse generating 410 is in a low level. As a result, the chip selection control signal CS_CON of a low level is latched. Under this state, the write/read strobe control signal WR_STB_C is outputted according to the page control signal P_CON.

At this time, if the chip selection signal CSB is in a high level, it is unnecessary to generate the write/read strobe signal WR_STB. Therefore, when the chip selection signal CSB is in a high level, the chip selection control signal CS_CON of a high level is latched to thereby prevent a generation of the write/read strobe signal WR_STB.

Meanwhile, at the write/read strobe generating block 500, when the chip selection control signal CSB4 is in a low level as the PSRAM device is enabled, the clock CLK is toggled, whereby the clock transition detection signal CTDB is continuously inputted in a low level. At this time, when the write/read strobe control signal WR_STB_C is inputted in a high level, the write/read strobe signal WR_STB is enabled in a high level for every clock, so that the PSRAM device can carry out the write/read operation.

In accordance with the embodiment of the present invention, the write/read strobe signal WR_STB necessary for the pre-charge operation and the write/read operation is controlled by the chip selection control signal CSB4 generated at the chip selection buffering block 200 in order for a data inputted at the tHD interval to be written on a memory cell. Thus, when the chip selection signal CSB having a low value of the tCBPH period is disabled right after the tHD period, the pre-charge operation for disabling a currently enabled word line is not carried out. After the tHD period, if the chip selection signal CSB is disabled, the write/read strobe signal WR_STB is generated to write a data on a memory cell.

Also, after the tHD period, if the chip selection signal CSB with a high value of the tCBPH period is inputted, the chip selection control signal CSB4 is disabled after a predetermined delay time. On the basis of the chip selection control signal CSB4, the word line is pre-charged to write a data, which is inputted lastly during the tHD period, on a memory cell.

On the basis of the embodiment of the present invention, it is possible to prevent a generation of a data error caused by a certain timing of a chip selection signal. The present application contains subject matter related to the Korean patent application No. KR 2005-0058496, filed in the Korean Patent Office on Jun. 30, 2005, the entire contents of which being incorporated herein by reference.

While the present invention has been described with respect to the particular embodiments, it will be apparent to those skilled in the art that various changes and modifications may be made without departing from the scope of the invention as defined in the following claims.

What is claimed is:

1. A semiconductor memory device having an enough margin for a write/read operation, comprising:
    a pre-charging block for performing a pre-charging operation based on a chip selection control signal;
    a write/read strobe generating block for performing a write/read operation based on the chip selection control signal and a chip selection signal; and
    a chip selection buffering block for generating the chip selection control signal based on the chip selection signal to control a timing of the pre-charging operation and a timing of the write/read operation.

2. The semiconductor memory device of claim 1, wherein the chip selection control signal is determined according to a period (tHD) from a rising edge of a clock to a rising edge of a chip selection signal and a high pulse retention period (tCBPH) of the chip selection signal by receiving a clock transition detection signal and the chip selection signal.

3. The semiconductor memory device of claim 2, wherein the write/read strobe generating block performs the write/read operation according to the chip selection control signal, a write/read strobe control signal and the clock transition detection.

4. The semiconductor memory device of claim 3, further comprising:
    a clock buffering block for buffering the clock to output the clock transition detection signal to the chip selection buffering block and the write/read strobe generating block in every rising edge of the clock; and
    a page controlling block outputting the write/read strobe control signal to the write/read strobe generating block for controlling the write/read operation according to the chip selection signal and an address transition control signal.

5. The semiconductor memory device of claim 4, wherein the page controlling block disables the write/read strobe control signal when the chip selection signal is disabled.

6. The semiconductor memory device of claim 4, wherein the page controlling block includes:
    a first pulse generating unit delaying the address transition control signal and generating a signal with a predetermined pulse width;
    a second pulse generating unit delaying the chip selection signal and generating a signal with a predetermined pulse width;
    a first voltage operating unit outputting a power voltage or a ground voltage according to an output from the first pulse generating unit and an output from the second pulse generating unit;
    a first latching unit latching an output from the first voltage operating unit and outputting another chip selection control signal;
    a first operating unit pre-charging an output terminal of the first voltage operating unit according to a power-up signal;
    a page control signal generating unit outputting a page control signal controlling a page operation according to the inverted address transition control signal; and
    a first logic operation unit performing a logic operation to the other chip selection control signal and the page control signal and outputting the write/read strobe control signal.

7. The semiconductor memory device of claim 6, wherein the first logic operation unit controls the write/read strobe control signal according to the page control signal as the chip selection control signal is in a low level when the address transition control signal is enabled.

8. The semiconductor memory device of claim 3, wherein the chip selection buffering block controls: the pre-charge operation to be performed at the next clock by retaining the chip selection control signal in a low level when the high pulse retention period is shorter than one cycle of the clock; and the pre-charge operation to be performed after a predetermined delay time by transiting the chip selection control signal to a high level when the high pulse retention period is longer than one cycle of the clock.

9. The semiconductor memory device of claim 4, wherein the chip selection buffering block controls: the pre-charge operation to be performed at the next clock by retaining the chip selection control signal in a low level when the high pulse retention period is shorter than one cycle of the clock; and the pre-charge operation to be performed after a predetermined delay time by transiting the chip selection control signal to a high level when the high pulse retention period is longer than one cycle of the clock.

10. The semiconductor memory device of claim 3, wherein the chip selection buffering block includes:
    a third pulse generating unit delaying the chip selection signal and outputting a signal with a predetermined pulse width to a first node;

a plurality of delaying units delaying the chip selection signal for a predetermined time and outputting the chip selection signal to a second node;

a second voltage operating unit controlling a voltage level of the fist node according to an output from the third pulse generating unit and the clock transition detection signal;

a second latching unit latching an output of the first node;

a second operating unit pre-charging the first node according to the power-up signal; and a second logic operation unit performing a logic operation to an output from the second latching unit, an output from the second node and the chip selection signal and outputting the chip selection control signal.

11. The semiconductor memory device of claim 4, wherein the chip selection buffering block includes:

a third pulse generating unit delaying the chip selection signal and outputting a signal with a predetermined pulse width to a first node;

a plurality of delaying units delaying the chip selection signal for a predetermined time and outputting the chip selection signal to a second node;

a second voltage operating unit controlling a voltage level of the fist node according to an output from the third pulse generating unit and the clock transition detection signal;

a second latching unit latching an output of the first node;

a second operating unit pre-charging the first node according to the power-up signal; and a second logic operation unit performing a logic operation to an output from the second latching unit, an output from the second node and the chip selection signal and outputting the chip selection control signal.

12. The semiconductor memory device of claim 3, wherein the write/read strobe generating block includes:

a third logic operation unit performing a logic operation to the chip selection control signal delayed for a predetermined time and the clock transition detection signal;

a fourth logic operation unit performing a logic operation to the write/read strobe control signal and an output from the third logic operation unit; and an inverter inverting an output from the fourth logic operation unit and outputting the write/read strobe signal.

13. The semiconductor memory device of claim 4, wherein the write/read strobe generating block includes:

a third logic operation unit performing a logic operation to the chip selection control signal delayed for a predetermined time and the clock transition detection signal;

a fourth logic operation unit performing a logic operation to the write/read strobe control signal and an output from the third logic operation unit; and an inverter inverting an output from the fourth logic operation unit and outputting the write/read strobe signal.

14. The semiconductor memory device of claim 12, wherein the third logic operation unit is a NOR gate.

15. The semiconductor memory device of claim 12, wherein the fourth logic operation unit is a NAND gate.

16. The semiconductor memory device of claim 13, wherein the third logic operation unit is a NOR gate.

17. The semiconductor memory device of claim 13, wherein the fourth logic operation unit is a NAND gate.

* * * * *